United States Patent
Nikonov et al.

(10) Patent No.: US 11,281,961 B2
(45) Date of Patent: Mar. 22, 2022

(54) RADIO FREQUENCY INTERCONNECTIONS FOR OSCILLATORY NEURAL NETWORKS

(71) Applicant: INTEL CORPORATION, Santa Clara, CA (US)

(72) Inventors: Dmitri Nikonov, Beaverton, OR (US); Sasikanth Manipatruni, Portland, OR (US); Ian Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 686 days.

(21) Appl. No.: 16/121,756

(22) Filed: Sep. 5, 2018

(65) Prior Publication Data

US 2020/0074268 A1 Mar. 5, 2020

(51) Int. Cl.
*G06N 3/04* (2006.01)
*H03K 3/03* (2006.01)
*H03L 7/099* (2006.01)
*H01L 23/66* (2006.01)
*H05K 1/02* (2006.01)

(52) U.S. Cl.
CPC .............. *G06N 3/04* (2013.01); *H01L 23/66* (2013.01); *H03K 3/0315* (2013.01); *H03L 7/0995* (2013.01); *H05K 1/0243* (2013.01); *H01L 2223/6627* (2013.01); *H01L 2223/6688* (2013.01)

(58) Field of Classification Search
CPC .............. H03L 7/0995; H03K 3/015; H01L 23/642–66; G06N 3/063–0635
See application file for complete search history.

(56) References Cited

U.S. PATENT DOCUMENTS

2017/0039472 A1* 2/2017 Kudo .................. G06N 3/063
2019/0122095 A1* 4/2019 Karg .................. G06N 3/063

OTHER PUBLICATIONS

G. Csaba, T. Ytterdal and W. Porod, "Oscillatory neural network from ring oscillators," CNNA 2016; 15th International Workshop on Cellular Nanoscale Networks and their Applications, 2016, pp. 1-2. (Year: 2016).*

(Continued)

*Primary Examiner* — Alia Sabur
(74) *Attorney, Agent, or Firm* — Schwabe, Williamson & Wyatt, P.C.

(57) ABSTRACT

Techniques are provided for radio frequency interconnections between oscillators and transmission lines for oscillatory neural networks (ONNs). An ONN gate implementing the techniques according to an embodiment includes a transmission line, a first oscillator circuit tuned to a first frequency based on a first tuning voltage associated with a first synapse weight, and a first capacitive coupler to couple the first oscillator circuit to the transmission line to generate an oscillating signal in the transmission line. The ONN gate further includes a second oscillator circuit tuned to a second frequency based on a second tuning voltage associated with a second synapse weight, and a second capacitive coupler to couple the second oscillator circuit to the transmission line to adjust the oscillating signal in the transmission line such that the amplitude of the adjusted oscillating signal is associated with a degree of match between the first frequency and the second frequency.

24 Claims, 5 Drawing Sheets

(56) References Cited

OTHER PUBLICATIONS

Jackson, Thomas & Shi, Rongye & Sharma, Abhishek & Bain, James & Weldon, Jeffrey & Pileggi, Lawrence. (2016). Implementing delay insensitive oscillatory neural networks using CMOS and emerging technology. Analog Integrated Circuits and Signal Processing. 89. 10.1007/S10470-016-0803-4. (Year: 2016).*

Liyanagedera, Chamika & Yogendra, Karthik & Roy, Kaushik & Fan, Deliang. (2016). Spin torque nano-oscillator based Oscillatory Neural Network. 1387-1394. 10.1109/IJCNN.2016.7727360. (Year: 2016).*

Popescu, Bogdan & Csaba, Gyorgy & Popescu, Dan & Fallahpour, Amir & Lugli, Paolo & Porod, Wolfgang & Becherer, Markus. (2018). Simulation of coupled spin torque oscillators for pattern recognition. Journal of Applied Physics. 124. 152128. 10.1063/1.5042423. (Year: 2018).*

Nikonov, D. et al., "Coupled-Oscillator Associative Memory Array Operation for Pattern Recognition", IEEE Journal on Exploratory Solid-State Computational Devices and Circuits, 2015, vol. 1, pp. 85-93.

\* cited by examiner

US 11,281,961 B2

RADIO FREQUENCY INTERCONNECTIONS FOR OSCILLATORY NEURAL NETWORKS

BACKGROUND

Neural networks are a computational approach which is based on a large collection of neural units loosely modeling the way the brain solves problems with large clusters of biological neurons connected by synapses. Each neural unit is connected with many others, and links can be enforcing or inhibitory in their effect on the activation state of connected neural units. Each individual neural unit may have a function which combines the values of all its inputs together in a selected way. There may also be a threshold function or limiting function on each connection, and on the unit itself, such that the threshold must be surpassed before it can propagate to other neurons. These systems are typically self-learning and trained rather than explicitly programmed and excel in areas where the problem solution is difficult to express in a traditional computer program. Implementing neural networks is non-trivial.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1:
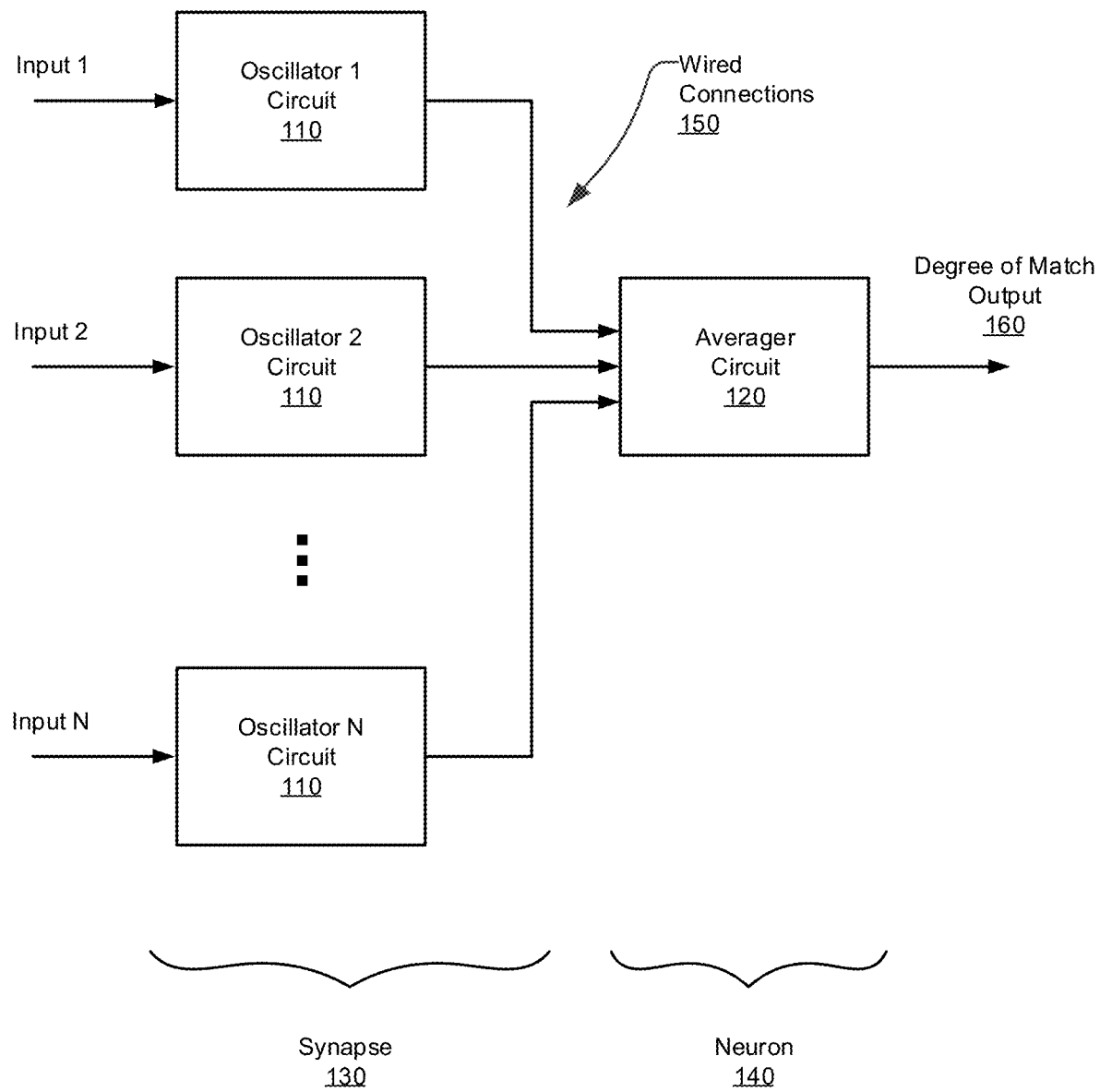
FIG. 1 is a block diagram of an oscillatory neural network (ONN) gate susceptible to interconnection latency and the problems that flow therefrom.

Although the following Detailed Description will proceed with reference being made to illustrative embodiments, many alternatives, modifications, and variations thereof will be apparent in light of this disclosure.

DETAILED DESCRIPTION

As previously noted, implementing neural networks is non-trivial, particularly within an integrated circuit. For instance, neural networks generally require a high degree of connectivity, with, in some cases, hundreds of fan-ins and fan-outs between neural gates. Additionally, the neuronal and synaptic components of these neural gates may be located on relatively distant portions of an integrated circuit. This can require large numbers of lengthy wires that create routing difficulties and introduce undesirable latencies in the signals between the synapses in the neuron. These problems are exacerbated for neural networks operating at higher speeds (e.g., employing higher frequency signals, such as radio frequency signals), and for oscillatory neural networks (ONNs) where phase accuracy is particularly important.

Thus, techniques are provided herein for implementing oscillatory neural network (ONN) gates. The techniques are particularly useful for implementing ONN gates on a substrate (e.g., bulk silicon substrate or wafer) or otherwise part of an integrated circuit or system-on-chip. In one example embodiment, an ONN gate includes a transmission line, first and second oscillator circuits, and first and second capacitive couplers. The first oscillator circuit is tuned to a first frequency (e.g., a first RF frequency) based on a first tuning voltage, the first tuning voltage associated with a first synapse weight. The first capacitive coupler couples the first oscillator circuit to the transmission line to generate an oscillating signal in the transmission line. The second oscillator circuit is tuned to a second frequency (e.g., a second RF frequency) based on a second tuning voltage, the second tuning voltage associated with a second synapse weight. The second capacitive coupler couples the second oscillator circuit to the transmission line to adjust the oscillating signal in the transmission line, wherein an amplitude of the adjusted oscillating signal is associated with a degree of match between the first frequency and the second frequency. Numerous configurations will be apparent.

So, as will be appreciated, the techniques can be used, for example, to implement radio frequency (RF) interconnections, using capacitive coupling, in the gates of an ONN. These RF interconnections allow for more efficient communication between the synapses (oscillators) and the neuron (averaging circuit) of an ONN gate, with reduced signal latency and improved phase synchronization. Additionally, RF interconnections avoid the routing difficulties associated with the large number of lengthy wire connections that would otherwise be needed to connect the multiple synapses to the neuron, and avoid the expense and complexity of alternative optical laser-based communication techniques. An embodiment of the present disclosure provides capacitive couplers between the oscillators and a looped transmission line, in which the transmission line is configured to perform the function of the averaging circuit, as will be described in greater detail below.

As noted above, the disclosed techniques can be implemented, for example, in an ONN within an integrated circuit (IC), although other embodiments will be apparent (e.g., components populated on a printed circuit board). The ONN comprises one or more ONN gates which include oscillator circuits and a transmission line. The ONN gates are configured with RF interconnections between the oscillators and the transmission line. Thus, in accordance with an embodiment, an ONN gate implementing the techniques includes a transmission line configured to function as an averaging circuit (the neuron component of the ONN gate). The ONN gate further includes two or more oscillator circuits configured to function as synapses of the ONN gate. The oscillator circuits are tunable to selected frequencies based on tuning voltages associated with synaptic weights and supplied input signals. The ONN gate further includes capacitive couplers configured to provide RF coupling between each of the oscillator circuits and the transmission line. A first oscillator circuit associated with a first capacitive coupler is configured to generate an oscillating signal in the transmission line. A second oscillator circuit associated with a second capacitive coupler is configured to adjust the oscillating signal in the transmission line such that the amplitude of the adjusted oscillating signal is associated with a degree of match between the first frequency and the second frequency. Any number of additional oscillator circuits may be similarly coupled to the transmission line to further adjust the oscillating signal in the transmission line. The capacitance values of the capacitive couplers are selected to determine a frequency locking range within which the oscillator circuits synchronize in frequency to each other, as will be explained in greater detail below.

As will be appreciated, the techniques described herein may allow for improved ONNs and ONN gates, compared to existing techniques that rely on wired connections between the oscillators and the averaging circuits which can introduce signal latency and phase instability issues, and raise signal routing complications. Additionally, the RF coupling dissipates less energy compared to wired connections. The disclosed techniques can be implemented on a broad range of platforms that may employ ONNs, including laptops, tablets, smart phones, workstations, video conferencing systems, gaming systems, smart home control systems, robotic systems, and low-power embedded DSP/CPU systems or devices.

FIG. 1 is a block diagram of an oscillatory neural network (ONN) gate 100 susceptible to interconnection latency and the problems that flow therefrom. The ONN gate is shown to include a number, N, of oscillator circuits 110, an averager circuit 120, and wired connections 150 to couple the outputs of the oscillator circuits to the input of the averager circuit. The oscillator circuit 110 performs the function of a synapse 130 of the ONN gate 100, and the averager circuit 120 performs the function of a neuron 140 of the ONN gate 100. The oscillator circuits generate signals at frequencies based on the input values. The output of the averager circuit is a value 160 that indicates the degree of match (e.g., similarity of frequencies) between all of the oscillator generated signals. In some embodiments, the output of the averager circuit is an alternating current (AC) signal and the degree of match is proportional to the amplitude of the AC signal. The degree of match (DOM), generated by one ONN gate in an oscillatory neural network may be compared to DOMs generated by other ONN gates to perform pattern matching, image recognition, or other desired neural network functions.

In a typical ONN gate, the number of oscillators, N, can be quite large (e.g., greater than 100), and the oscillators can be located at widely varying locations relative to the averager circuit. It can thus be challenging to efficiently route the wired connections 150. Additionally, the differing lengths of each of the wired connections results in varying latencies and phase shifts among the oscillator signals arriving at the averager circuit, which can adversely affect the performance of the ONN gate 100.

Figure 2:
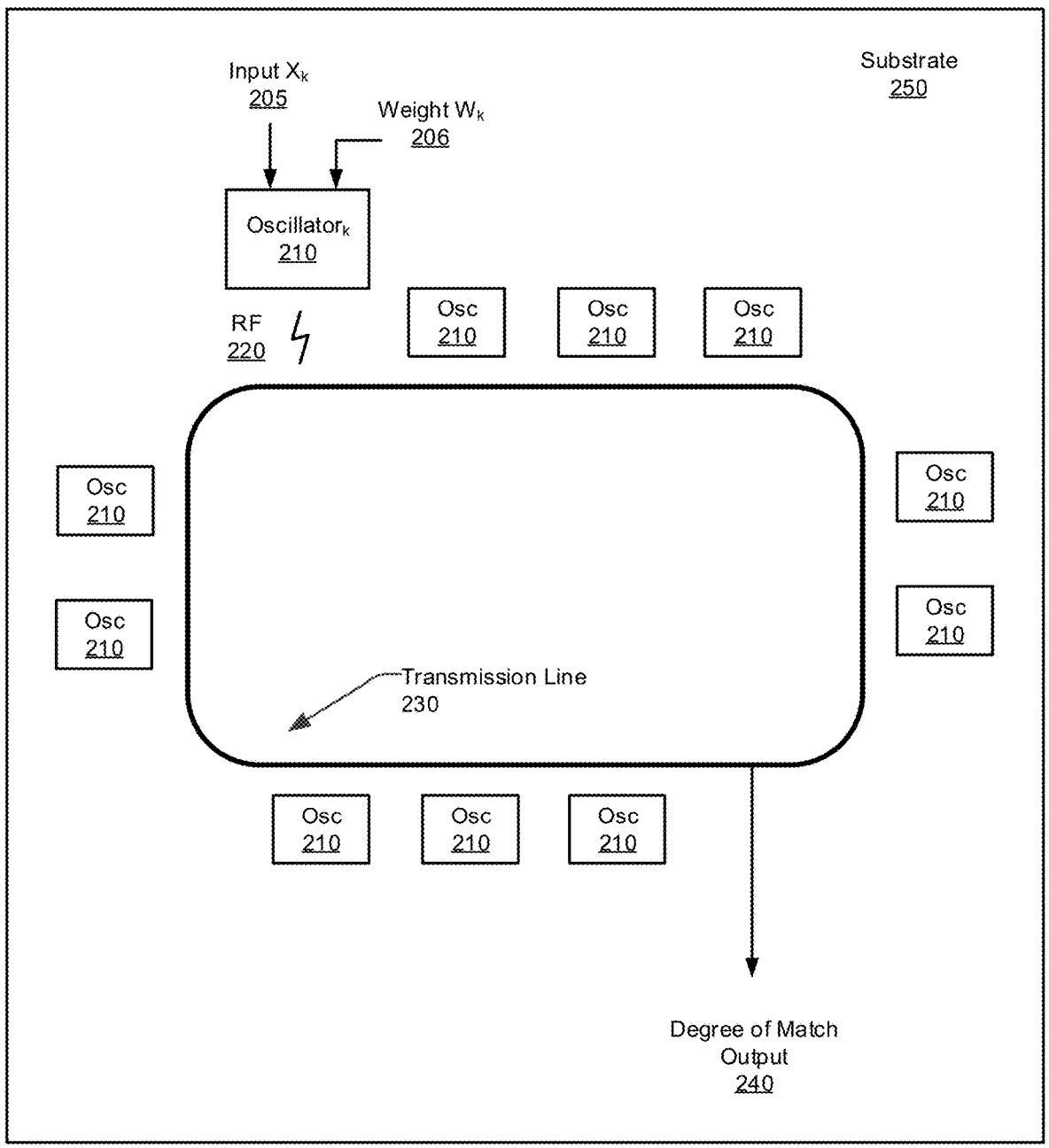
FIG. 2 illustrates a transmission line ONN gate with radio frequency (RF) interconnections, configured in accordance with certain embodiments of the present disclosure.

FIG. 2 illustrates a transmission line ONN gate with radio frequency (RF) interconnections 200, configured in accordance with certain embodiments of the present disclosure. A number of oscillators 210 are shown to be disposed, for example on a substrate 250, in proximity to a transmission line 230, which is also disposed on the substrate and configured in a loop. In some embodiments, substrate 250 could be, for instance, a group IV substrate (e.g., bulk silicon or germanium substrate, or a SiGe layer), or a group III-V substrate (e.g., GaAs, InGaAs, or GaSb), or a wafer of any of these materials.

Each oscillator 210 ($Osc_k$ for k=1, . . . N) is capacitively coupled to the transmission line 230, creating an RF interconnection 220, as will be explained in greater detail below. Each oscillator generates an oscillatory signal at a frequency that depends on an input value $x_k$ 205, and a weight value $w_k$ 206, supplied to that oscillator. The oscillator circuits 210 are all coupled to the transmission line 230 and will synchronize to each other if their frequencies are close, which is to say, if their frequencies lie within a locking range. To the extent that the oscillator circuits synchronize, the oscillatory signals will constructively add (e.g., sum in phase) in the transmission line and the resulting amplitude will be relatively large, indicating a high degree of match 240. Conversely, if many of the oscillators fail to synchronize, because their frequencies differ too greatly (e.g., fall outside of the locking range), the oscillatory signals will drift in phase relative to each other and the sum of their outputs will decrease to near zero amplitude, indicating a low degree of match 240. The transmission line thus performs the function of an averaging circuit applied to the oscillator outputs.

Figure 3:
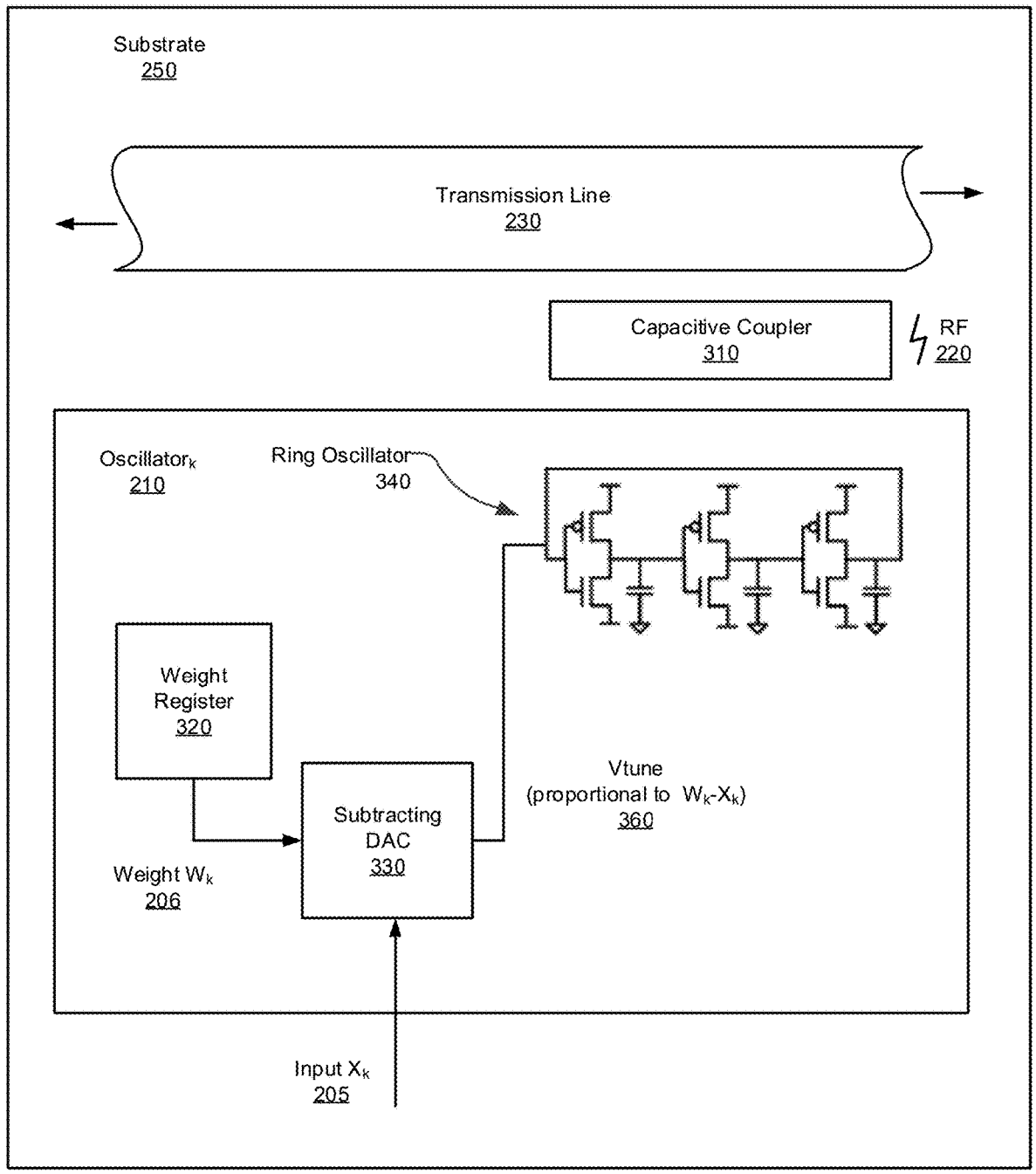
FIG. 3 is a more detailed diagram of an oscillator-transmission line capacitive coupling, configured in accordance with certain embodiments of the present disclosure.

FIG. 3 is a more detailed diagram of an oscillator-transmission line capacitive coupling 300, configured in accordance with certain embodiments of the present disclosure. Oscillator ($Osc_k$) 210 is shown to include a weight register 320, a subtracting digital to analog converter (DAC) 330, and a ring oscillator circuit 340. Also shown is capacitive coupling element 310 in proximity to a segment of the transmission line 230.

The weight register 320 is configured to store a learned or memorized weight value $w_k$ 206 associated with the synapse represented by this oscillator. In some cases, for example in a pattern matching application, the weight may correspond to a pixel value of a potentially matching memorized pattern.

The subtracting DAC 330 is configured to calculate the difference between an input value $x_k$ 205 and the weight value $w_k$ 206, and to generate an output analog tuning voltage Vtune 360 proportional to the difference $w_k - x_k$. Returning to the case of a pattern matching application, the input value $x_k$ 205 may correspond to a pixel value of a test pattern to which a match is being sought.

Oscillator 340 is configured to generate an oscillatory signal at a frequency proportional to the tuning voltage Vtune 360. Oscillator 340 is configured, in this embodiment, as a ring oscillator comprising three inverting amplifiers which are serially coupled into a feedback loop. In some embodiments, other known oscillator configurations may be employed in light of the present disclosure, such as any ring oscillator having an odd number (e.g., 5, 7, etc.) of inverting amplifiers serially coupled into a feedback loop. In some embodiments, the oscillator is a self-biased ring oscillator comprising an arbitrary number of differential stages.

The capacitive coupler 310 is configured to provide a capacitively coupled RF interconnection 220 between the oscillator 340 and the proximate section of transmission line 230. The capacitance value of the coupler 310 is chosen to determine the frequency locking range. In some embodiments, the locking range is determined according to the following formula:

$$\Delta \omega < \frac{C \omega^2 V_{cc}}{I_{drv}}$$

where C is the chosen capacitance value, $\Delta \omega$ is the locking frequency range (in radians), $\omega$ is the frequency (in radians) of this oscillatory signal generated by the oscillator circuit, $V_{cc}$ is the output voltage of the oscillator circuit, and $I_{drv}$ is the current driving the oscillator circuit.

Returning again to the pattern matching example, the match is dependent on the synchronization of the frequencies of the oscillators. For example, if the test and the memorized patterns are close, the shifts between oscillator frequencies associated with each pixel will be small and the coupled oscillators will synchronize. Conversely, if the test and the memorized patterns are significantly different, many oscillators will be detuned and the oscillators will fail to synchronize to a single frequency. If the oscillators synchronize, the outputs add in phase and the DOM in the transmission line is relatively large, indicating a match. If the oscillators do not synchronize, the phases of the oscillators will drift relative to each other and their outputs sum to a signal in the transmission line of approximately zero amplitude, indicating that there is not a match. The transmission line thus acts as an averager of the oscillator outputs.

In some embodiments, the oscillator circuits 210 may be configured to be tunable over a range of 10 to 100 GHz, and the capacitance of the capacitive couplers may be selected such that the locking range is on the order of 0.5 GHz. The transmission line 230 is configured to provide the bandwidth required to support several groups of oscillators being synchronized to different frequencies.

In some embodiments, the number of oscillator circuits 210 may be in the range of 30 to 300, and the spacing or distance between oscillator circuits may be in the range of 1 to 10 millimeters. The relatively large spacing between oscillators may be based on the desire to locate them close to sensors or devices that are providing the input values 205. Such sensors may be relatively large and may be located on separate cores or distant portions of an integrated circuit.

Methodology

Figure 4:
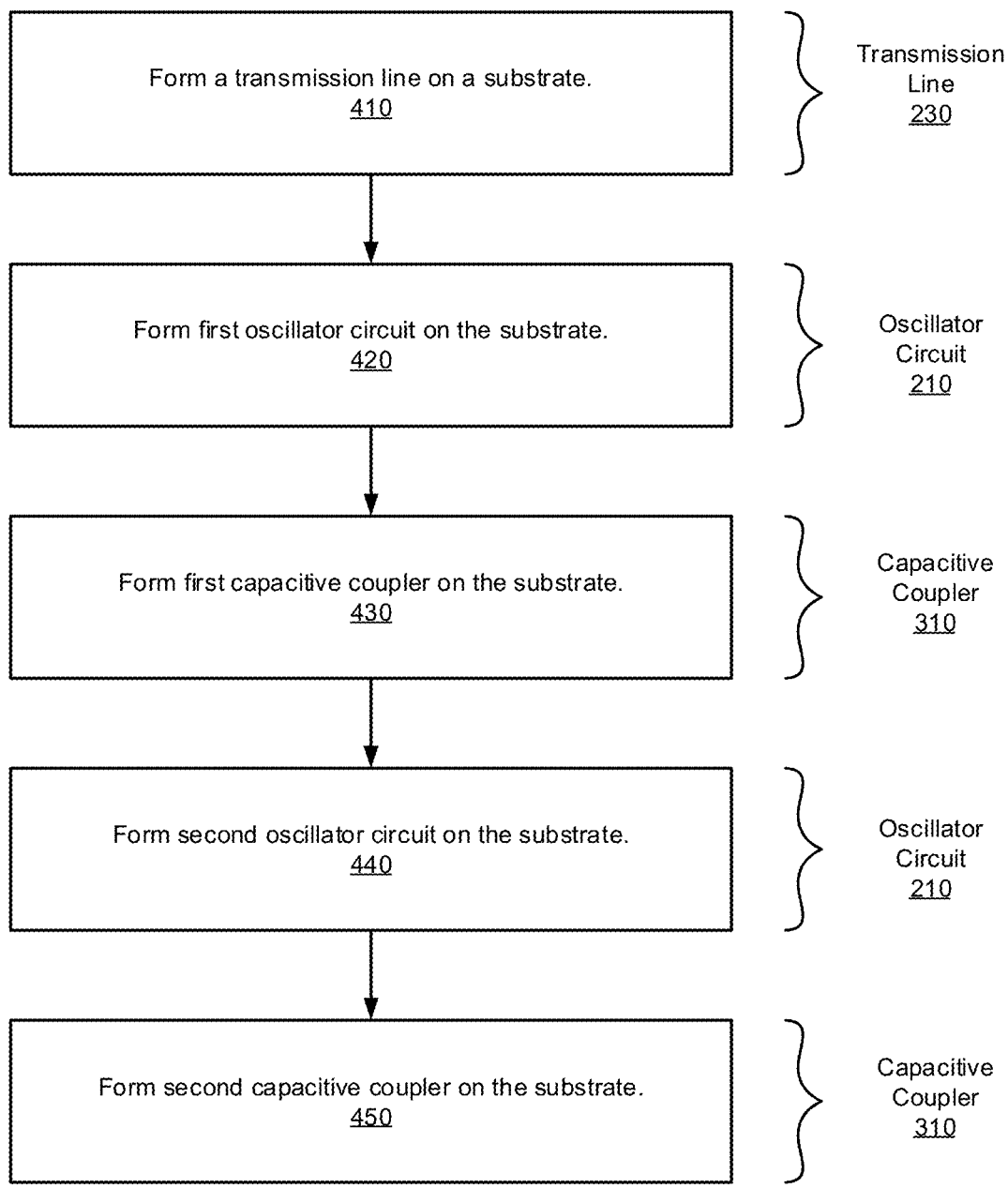
FIG. 4 is a flowchart illustrating a methodology for forming an ONN gate, in accordance with certain embodiments of the present disclosure.

FIG. 4 is a flowchart illustrating an example method 400 for forming or otherwise populating one or more ONN gates on a substrate, in accordance with certain embodiments of the present disclosure. As can be seen, the example method includes a number of phases and sub-processes, the sequence of which may vary from one embodiment to another. However, when considered in the aggregate, these phases and sub-processes form a process for forming an ONN gate, in accordance with certain of the embodiments disclosed herein. These embodiments can be implemented, for example, using the system architecture illustrated in FIGS. 2-3, as described above. However other system architectures can be used in other embodiments, as will be apparent in light of this disclosure. To this end, the correlation of the various functions shown in FIG. 4 to the specific components illustrated in the other figures is not intended to imply any structural and/or use limitations. Rather, other embodiments may include, for example, varying degrees of integration wherein multiple functionalities are effectively performed by one system. Thus, other embodiments may have fewer or more modules and/or sub-modules depending on the granularity of implementation. Numerous variations and alternative configurations will be apparent in light of this disclosure.

As illustrated in FIG. 4, in an embodiment, method 400 for forming an ONN gate on a substrate commences by forming, at operation 410, a transmission line on the substrate. In some embodiments, the substrate may be a semiconductor substrate, a semiconductor wafer, or a printed circuit board. In some embodiments, the transmission line is configured as a closed loop.

Next, at operation 420, a first oscillator circuit is formed on the substrate. The first oscillator circuit is configured to be tunable to a selected frequency based on a supplied tuning voltage, the tuning voltage associated with a synapse weight for that oscillator.

At operation 430, a first capacitive coupler is formed on the substrate. The first capacitive coupler is configured to couple the first oscillator circuit to the transmission line to generate an oscillating signal in the transmission line.

At operation 440, a second oscillator circuit is formed on the substrate. The second oscillator circuit is configured to be tunable to another selected frequency based on another supplied tuning voltage, the tuning voltage associated with a synapse weight for the second oscillator. In some embodiments, the oscillators may be separated by a distance in the range of 1 to 10 mm.

At operation 450, a second capacitive coupler is formed on the substrate. The second capacitive coupler is configured to couple the second oscillator circuit to the transmission line to adjust the oscillating signal in the transmission line such that an amplitude of the adjusted oscillating signal is associated with a degree of match between the first selected frequency and the second selected frequency. The capacitance values of the capacitive couplers are selected to determine a frequency locking range such that the first ring oscillator circuit synchronizes in frequency to the second ring oscillator circuit when the first selected frequency and the second selected frequency are within the frequency locking range.

Of course, in some embodiments, additional operations may be performed, as previously described in connection with the system. For example, the first oscillator circuit and the second oscillator circuit may be configured as ring oscillator. In some embodiments, the ring oscillators may comprise three inverter circuits serially coupled in a feedback loop. In some embodiments, subtracting DACs are formed on the substrate, and configured to generate the tuning voltages based on a difference between the synapse weights and input values.

Example System

Figure 5:
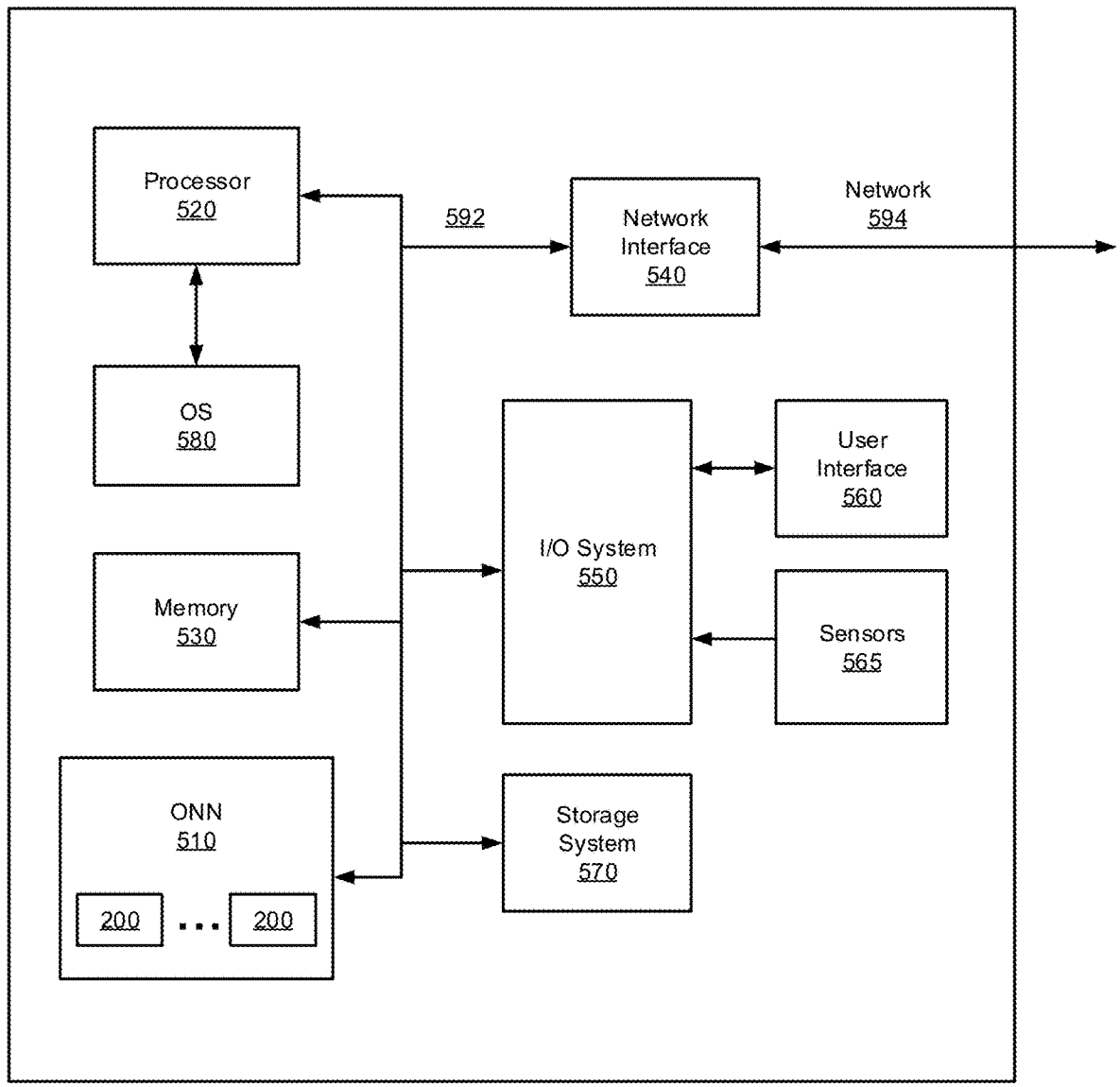
FIG. 5 is a block diagram schematically illustrating a device platform configured to employ an ONN with RF interconnections, in accordance with certain embodiments of the present disclosure.

FIG. 5 illustrates an example device platform 500, configured in accordance with certain embodiments of the present disclosure, to employ an ONN comprising ONN gates with RF interconnections. In some embodiments, platform 500 may be hosted on, or otherwise be incorporated into a personal computer, workstation, server system, smart home management system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, wearable device, embedded system, and so forth. Any combination of different devices may be used in certain embodiments.

In some embodiments, platform 500 may comprise any combination of a processor 520, a memory 530, an ONN 510 (comprising any number of ONN gates 200), a network interface 540, an input/output (I/O) system 550, a user interface 560, sensors 565, and a storage system 570. As can be further seen, a bus and/or interconnect 592 is also provided to allow for communication between the various components listed above and/or other components not shown. Platform 500 can be coupled to a network 594 through network interface 540 to allow for communications with other computing devices, platforms, devices to be controlled, or other resources. Other componentry and functionality not reflected in the block diagram of FIG. 5 will be apparent in light of this disclosure, and it will be appreciated that other embodiments are not limited to any particular hardware configuration.

Processor 520 can be any suitable processor, and may include one or more coprocessors or controllers, such as an audio processor, a graphics processing unit, or hardware accelerator, to assist in control and processing operations associated with platform 500. In some embodiments, the processor 520 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 520 may be implemented as a complex instruction set computer (CISC) or a reduced instruction set computer (RISC) processor. In some embodiments, processor 520 may be configured as an x86 instruction set compatible processor.

Memory 530 can be implemented using any suitable type of digital storage including, for example, flash memory and/or random-access memory (RAM). In some embodiments, the memory 530 may include various layers of memory hierarchy and/or memory caches as are known to those of skill in the art. Memory 530 may be implemented as a volatile memory device such as, but not limited to, a RAM, dynamic RAM (DRAM), or static RAM (SRAM) device. Storage system 570 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 570 may comprise technology to increase the storage performance enhanced protection for valuable digital media when multiple hard drives are included.

Processor 520 may be configured to execute an Operating System (OS) 580 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 500, and therefore may also be implemented using any suitable existing or subsequently-developed platform.

Network interface circuit 540 can be any appropriate network chip or chipset which allows for wired and/or wireless connection between other components of device platform 500 and/or network 594, thereby enabling platform 500 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 550 may be configured to interface between various I/O devices and other components of device platform 500. I/O devices may include, but not be limited to, user interface 560 and sensors 565. User interface 560 may include devices (not shown) such as a speaker, microphone, display element, touchpad, keyboard, and mouse, etc. Sensors 565 may include any type of data acquisition circuits or mechanisms configured to provide data, for example to be processed by the ONN 510 and/or ONN gates 200. I/O system 550 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 520 or any chipset of platform 500.

It will be appreciated that in some embodiments, the various components of platform 500 may be combined or integrated in a system-on-a-chip (SoC) architecture. In some embodiments, the components may be hardware components, firmware components, software components or any suitable combination of hardware, firmware or software.

ONN 510 is configured to employ any number of ONN gates 200 with RF interconnections, as described previously. ONN gates 200 may include any or all of the circuits/components illustrated in FIGS. 2-3, as described above. For example, the outputs of the ONN gates 200, representing a degree of match, may be coupled to a winner take all circuit to generate a recognition result based on the largest DOM value, as previously described.

In various embodiments, platform 500 may be implemented as a wireless system, a wired system, or a combination of both. When implemented as a wireless system, platform 500 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 500 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic.NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 594. In other embodiments, the functionalities disclosed herein can be incorporated into other applications, such as, for example, automobile control/navigation, smart-home management, entertainment, and robotic applications. The applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 500 may comprise additional, fewer, or alternative subcomponents as compared to those included in the example embodiment of FIG. 5.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method, process, and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is an oscillatory neural network (ONN) gate comprising: a transmission line; a first oscillator circuit tuned to a first frequency based on a first tuning voltage, the first tuning voltage associated with a first synapse weight; a first capacitive coupler to couple the first oscillator circuit to the transmission line to generate an oscillating signal in the transmission line; a second oscillator circuit tuned to a second frequency based on a second tuning voltage, the second tuning voltage associated with a second synapse weight; and a second capacitive coupler to couple the second oscillator circuit to the transmission line to adjust the oscillating signal in the transmission line, wherein an amplitude of the adjusted oscillating signal is associated with a degree of match between the first frequency and the second frequency.

Example 2 includes the subject matter of Example 1, wherein the first oscillator circuit and the second oscillator circuit are ring oscillators.

Example 3 includes the subject matter of Examples 1 or 2, wherein the ring oscillators comprise an odd number of inverter circuits serially coupled in a feedback loop.

Example 4 includes the subject matter of any of Examples 1-3, wherein capacitance values of the first capacitive coupler and the second capacitive coupler are selected to determine a frequency locking range such that the first oscillator circuit synchronizes in frequency to the second oscillator circuit when the first frequency and the second frequency are within the frequency locking range.

Example 5 includes the subject matter of any of Examples 1-4, wherein the frequency locking range is proportional to the selected capacitance values, the square of the first frequency, and an output voltage of the first oscillator circuit.

Example 6 includes the subject matter of any of Examples 1-5, wherein the frequency locking range is inversely proportional to a current driving the first oscillator circuit.

Example 7 includes the subject matter of any of Examples 1-6, further comprising a subtracting digital to analog converter (DAC) to generate the first tuning voltage based on a difference between the first synapse weight and a first input value.

Example 8 includes the subject matter of any of Examples 1-7, wherein the subtracting DAC is a first subtracting DAC, the ONN gate further comprising a second subtracting DAC to generate the second tuning voltage based on a difference between the second synapse weight and a second input value.

Example 9 includes the subject matter of any of Examples 1-8, further comprising registers to store the first synapse weight and the second synapse weight.

Example 10 includes the subject matter of any of Examples 1-9, wherein the transmission line is configured as a closed loop.

Example 11 includes the subject matter of any of Examples 1-10, further comprising additional oscillator circuits, wherein the number of additional oscillator circuits is in the range of 30-300.

Example 12 includes the subject matter of any of Examples 1-11, wherein the first and second oscillator circuits are separated by a distance in a range of 1 to 10 millimeters.

Example 13 includes the subject matter of any of Examples 1-12, wherein the transmission line simulates a neuron of the ONN gate and the first and second oscillator circuits simulate synapses of the ONN gate.

Example 14 includes the subject matter of any of Examples 1-13, wherein the first and second frequencies are in a range of 10 GHz to 100 GHz.

Example 15 is an integrated circuit comprising two or more of the ONN gates of any of Examples 1-14.

Example 16 is a method of forming an oscillatory neural network (ONN) gate, the method comprising: forming a transmission line on a substrate, the transmission line configured as a closed loop; forming a first oscillator circuit on the substrate, the first oscillator circuit tunable to a first frequency based on a first tuning voltage, the first tuning voltage associated with a first synapse weight; forming a first capacitive coupler on the substrate, the first capacitive coupler to couple the first oscillator circuit to the transmission line to generate an oscillating signal in the transmission line; forming a second oscillator circuit on the substrate, the second oscillator circuit tunable to a second frequency based on a second tuning voltage, the second tuning voltage associated with a second synapse weight; and forming a second capacitive coupler on the substrate, the second capacitive coupler to couple the second oscillator circuit to the transmission line to adjust the oscillating signal in the transmission line, wherein an amplitude of the adjusted oscillating signal is associated with a degree of match between the first frequency and the second frequency.

Example 17 includes the subject matter of Example 16, wherein the first oscillator circuit and the second oscillator circuit are ring oscillators, the ring oscillators comprising an odd number of inverter circuits serially coupled in a feedback loop.

Example 18 includes the subject matter of Examples 16 or 17, wherein capacitance values of the first capacitive coupler and the second capacitive coupler are selected to determine a frequency locking range such that the first ring oscillator circuit synchronizes in frequency to the second ring oscillator circuit when the first frequency and the second frequency are within the frequency locking range.

Example 19 includes the subject matter of any of Examples 16-18, wherein the frequency locking range is proportional to the selected capacitance values, the square of the first frequency, and an output voltage of the ring oscillator, and the frequency locking range is inversely proportional to a current driving the ring oscillator.

Example 20 includes the subject matter of any of Examples 16-19, further comprising forming a subtracting digital to analog converter (DAC) on the substrate, the subtracting DAC to generate the first tuning voltage based on a difference between the first synapse weight and a first input value.

Example 21 includes the subject matter of any of Examples 16-20, wherein the first and second oscillator circuits are separated by a distance in a range of 1 to 10 millimeters.

Example 22 includes the subject matter of any of Examples 16-21, wherein the substrate is a semiconductor substrate.

Example 23 includes the subject matter of any of Examples 16-22, wherein the substrate is a semiconductor wafer.

Example 24 includes the subject matter of any of Examples 16-23, wherein the substrate is a printed circuit board.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. An oscillatory neural network (ONN) gate comprising:
   a transmission line;
   a first oscillator circuit tuned to a first frequency based on a first tuning voltage, the first tuning voltage associated with a first synapse weight;
   a first capacitive coupler to couple the first oscillator circuit to the transmission line to generate an oscillating signal in the transmission line;
   a second oscillator circuit tuned to a second frequency based on a second tuning voltage, the second tuning voltage associated with a second synapse weight; and
   a second capacitive coupler to couple the second oscillator circuit to the transmission line to adjust the oscillating signal in the transmission line, wherein an amplitude of the adjusted oscillating signal is associated with a degree of match between the first frequency and the second frequency.

2. The ONN gate of claim 1, wherein the first oscillator circuit and the second oscillator circuit are ring oscillators.

3. The ONN gate of claim 2, wherein the ring oscillators comprise an odd number of inverter circuits serially coupled in a feedback loop.

4. The ONN gate of claim 1, wherein capacitance values of the first capacitive coupler and the second capacitive coupler are selected to determine a frequency locking range such that the first oscillator circuit synchronizes in frequency to the second oscillator circuit when the first frequency and the second frequency are within the frequency locking range.

5. The ONN gate of claim 4, wherein the frequency locking range is proportional to the selected capacitance values, the square of the first frequency, and an output voltage of the first oscillator circuit.

6. The ONN gate of claim 4, wherein the frequency locking range is inversely proportional to a current driving the first oscillator circuit.

7. The ONN gate of claim 1, further comprising a subtracting digital to analog converter (DAC) to generate the first tuning voltage based on a difference between the first synapse weight and a first input value.

8. The ONN gate of claim 7, wherein the subtracting DAC is a first subtracting DAC, the ONN gate further comprising a second subtracting DAC to generate the second tuning voltage based on a difference between the second synapse weight and a second input value.

9. The ONN gate of claim 1, further comprising registers to store the first synapse weight and the second synapse weight.

10. The ONN gate of claim 1, wherein the transmission line is configured as a closed loop.

11. The ONN gate of claim 1, further comprising additional oscillator circuits, wherein the number of additional oscillator circuits is in the range of 30-300.

12. The ONN gate of claim 1, wherein the first and second oscillator circuits are separated by a distance in a range of 1 to 10 millimeters.

13. The ONN gate of claim 1, wherein the transmission line simulates a neuron of the ONN gate and the first and second oscillator circuits simulate synapses of the ONN gate.

14. The ONN gate of claim 1, wherein the first and second frequencies are in a range of 10 GHz to 100 GHz.

15. An integrated circuit comprising two or more of the ONN gates of any of claim 1.

16. A method of forming an oscillatory neural network (ONN) gate, the method comprising:
   forming a transmission line on a substrate, the transmission line configured as a closed loop;
   forming a first oscillator circuit on the substrate, the first oscillator circuit tunable to a first frequency based on a first tuning voltage, the first tuning voltage associated with a first synapse weight;
   forming a first capacitive coupler on the substrate, the first capacitive coupler to couple the first oscillator circuit to the transmission line to generate an oscillating signal in the transmission line;
   forming a second oscillator circuit on the substrate, the second oscillator circuit tunable to a second frequency based on a second tuning voltage, the second tuning voltage associated with a second synapse weight; and
   forming a second capacitive coupler on the substrate, the second capacitive coupler to couple the second oscillator circuit to the transmission line to adjust the oscillating signal in the transmission line, wherein an amplitude of the adjusted oscillating signal is associated with a degree of match between the first frequency and the second frequency.

17. The method of claim 16, wherein the first oscillator circuit and the second oscillator circuit are ring oscillators, the ring oscillators comprising an odd number of inverter circuits serially coupled in a feedback loop.

18. The method of claim 17, wherein capacitance values of the first capacitive coupler and the second capacitive coupler are selected to determine a frequency locking range such that the first ring oscillator circuit synchronizes in frequency to the second ring oscillator circuit when the first frequency and the second frequency are within the frequency locking range.

19. The method of claim 17, wherein the frequency locking range is proportional to the selected capacitance values, the square of the first frequency, and an output voltage of the ring oscillator, and the frequency locking range is inversely proportional to a current driving the ring oscillator.

20. The method of claim 16, further comprising forming a subtracting digital to analog converter (DAC) on the substrate, the subtracting DAC to generate the first tuning voltage based on a difference between the first synapse weight and a first input value.

21. The method of claim 16, wherein the first and second oscillator circuits are separated by a distance in a range of 1 to 10 millimeters.

22. The method of claim 16, wherein the substrate is a semiconductor substrate.

23. The method of claim 16, wherein the substrate is a semiconductor wafer.

24. The method of claim 16, wherein the substrate is a printed circuit board.

* * * * *